United States Patent [19]

Ikoma

[11] Patent Number: 4,581,589

[45] Date of Patent: Apr. 8, 1986

[54] APPARATUS FOR AVOIDING CLIPPING OF AMPLIFIER

[75] Inventor: Tsuneo Ikoma, Osaka, Japan

[73] Assignee: Toa Electric Co., Ltd., Kobe, Japan

[21] Appl. No.: 609,855

[22] Filed: May 14, 1984

[30] Foreign Application Priority Data

May 17, 1983 [JP] Japan ............................ 58-74194[U]

[51] Int. Cl.⁴ .............................................. H03G 3/30
[52] U.S. Cl. .................... 330/280; 330/138;
330/145; 330/284; 330/308
[58] Field of Search ................. 330/59, 144, 145, 138, 330/280, 284, 308

[56] References Cited

U.S. PATENT DOCUMENTS 3,248,642  4/1966  Rothschild ...................... 330/280 X
4,048,573  9/1977  Evans et al. ........................... 330/2
4,233,566  11/1980  Nestorovic ..................... 330/138 X Primary Examiner—James B. Mullins
Attorney, Agent, or Firm—Wenderoth, Lind & Ponack

[57] ABSTRACT

A preclipping control technique is utilized to prevent the occurrence of clipping distortions evidenced in the output of an amplifier. Reference means provides an upper voltage level slightly lower than the upper saturation or clipping level of the amplifier output signal, and also provides a lower voltage level slightly higher than the lower saturation or clipping level of the amplifier output signal. A comparator is connected to the output of the amplifier and compares the output signal with the reference levels. Under normal conditions, when the output signal is located within the range lying between the upper and lower reference levels, the amplifier input signal is not attenuated. However, when the output signal goes out of the range, this will activate an attenuator connected between a signal source and the amplifier to introduce a controlled attenuation in the amplifier input signal; clipping is prevented.

11 Claims, 8 Drawing Figures

APPARATUS FOR AVOIDING CLIPPING OF AMPLIFIER

FIELD OF THE INVENTION

The present invention relates to amplifiers, and particularly to an apparatus for avoiding clipping evidenced in the output of an amplifier in response to an excess input signal.

BACKGROUND OF THE INVENTION

High fidelity amplifiers maintain good linear characteristics for source signal having normal amplitudes.

However, for excess source levels, the amplfiers go beyond their linear range and are saturated. This is called "clipping" because the amplifiers output clipped or truncated signals.

For audio-applications, clipping distortions impair sound quality and clarity and sometimes damage a loud-speaker coupled to the output of the amplifier.

U.S. Pat. No. 4,048,573 to Evans et al discloses an apparatus which reduces clipping distortions. FIG. 1 is originally described in this United States Patent. The source signal passes through a preamplifier 10 to a main or power amplifier 20. The output signal of the power amplifier 20 is provided to one input of a differential amplifier 30 through a feedback circuit 25. The output signal of the preamplifier is also provided to the other input of the differential amplifier 30. The function of the differential amplifier is to produce a signal indicative of the occurence of clipping when the input and output signals of the power amplifiers differ. The output signal from the differential amplifier is fed to a full wave rectifier 32, the output of which drives an attenuator 31 as well as a limit lamp driver 33.

In normal operation (i.e. when the input signal has normal amplitudes), the differential amplifier does not develop any signal because its input signals are the same in strength and waveform. Thus, no attenuation is introduced in the signal applied to the power amplifier.

On the other hand, when an excess input is fed to the power amplifier 20, the latter will produce clipping. Therefore, the differential amplifier 30 produces an output signal in accordance with the difference between the amplifier input signal and the amplifier output signal through the feedback circuit 25. This difference will introduce a corresponding attenuation in the input signal to the amplifier 20 by means of full wave rectifier 32 and signal attenuator 31 coupled to the output of the differential amplifier 30.

While the apparatus disclosed in this United States Patent serves to minimize clipping distortions, the control of signal attenuation does not start until the clipping occurs and is observed at the differential amplifier 30. This is a "post clipping" control method. In other words, the technique utilized in this United States Patent is to compare amplifier input with output signals. Since the amplifier output signal is also distorted depending upon the characteristics of the load (e.g. inductive or capacitive loud-speaker), this latter distortion, i.e. the distortion caused by factors other than clipping, would be detected by the differential amplifier 30 if the latter has a very high sensitivity, with the result that the amplifier input signal is attenuated. Such erroneous attenuation in the input signal is undesirable for the purpose of maintaining a high power output signal at the amplifier output.

SUMMARY OF THE INVENTION

The primary object of the present invention is to provide an apparatus which prevents clipping distortions evidenced in the output of an amplifier in association with the saturation thereof.

Another object of the present invention is to provide such an apparatus which operates on (starts reducing) an input signal before clipping distortions actually occurs, thus preventing the occurrence of clipping. We name this control a "pre-clipping" control technique.

Another object of the present invention is to provide such an apparatus which does not malfunction (i.e. does not provide an erroneous attenuation in the amplifier input signal) for those distortions in the amplifier output that do not relate to clipping which is the result of an excess input signal to the amplifier.

In accordance with one aspect of the present invention, there is provided an apparatus for preventing the clipping distortions evidenced in the output of an amplifier in association with the saturation of that amplifier having upper saturation and lower saturation voltages wherein the improvement comprises:

reference means for providing a upper reference voltage lower than the upper saturation voltage and a lower reference voltage higher than the lower saturation voltage;

attenuator means for introducing a variable attenuation in the input signal to the amplifier;

means for comparing the reference voltages with the output signal from the amplifier; and means coupled to the comparing means for controlling the attenuator means so that the attenuator means reduces the input signal to the amplifier when the output signal from the amplifier goes out of the range between the upper and lower reference voltages, whereby the amplifier always operates properly without any clipping in its output signal.

The amplifier may be of the double supply type having a pair of supply terminals with one energized with a positive potential and the other with a negative potential, each normally having the same amplitude as the other. A single supply type can also be used which has a pair of supply terminals with one being grounded.

Preferably, the above reference means is connected to a voltage supply or source which is the same source that energizes the amplifier. The reference means is preferably implemented by a voltage divider connected to a voltage source and consisting of three resistors in series connection. Thus, the first node or junction between the first and second resistors provides the first or upper reference voltage while the second node or junction between the second and third resistors provides the second or lower reference voltage.

Preferably, there is provided a means which is disposed between the output of the amplifier and the reference nodes of the voltage divider, and selectively passes the amplifier output signal to the reference nodes when the output signal goes out of the range lying between the two reference voltages. If this occurs, the control means responsively operates on the attenuator means so that the amplifier input signal is attenuated to prevent the occurrence of clipping.

The combination of the voltage divider and the means for selecting the passing of the amplifier output signal has advantage in that the number of circuit components in the apparatus is minimized.

The control means preferably comprises current supply means which responds to the output signal from the comparing means, and electric energy storing means which is charged by a charging current from the current supply means. Preferably, the storing means comprises a charge circuit having a relatively short time constant and a discharge circuit having a relatively long time constant whereby the apparatus can quickly respond when the output signal of the amplifier goes out of the normal range (i.e. this signal indicates that clipping would very likely occur shortly unless a rapid control for the purpose of reducing the input signal is effected), as well as maintaining a controlled attenuation in the input signal whenever there is a risk of the occurrence of clipping.

In the case wherein the amplifier is coupled to a variable load (e.g. a variable number of loud-speakers), it is desirable that the apparatus is immune to the variation in load. For this purpose, an intermediate output signal rather than the final output signal of the amplifier is preferably utilized as an input to the comparing means for comparison with the reference voltages. In one embodiment, the intermediate signal is a signal which is produced by the driver circuit section of the amplifier and is supplied to a current amplification circuit i.e. the last stage of the amplifier. With this arrangement, the comparison can be made without being affected by the voltage drop in the current amplification circuit, which voltage drop depends on the value of the load coupled to the amplifier.

BRIEF DESCRIPTION OF THE DRAWINGS

The above and other objects, features and advantages will be apparent as the description proceeds in conjunction with the accompanying drawings in which.

DETAILED DESCRIPTION OF PREFERRED EMBODIMENTS

Before turning to the drawings, it will be convenient to describe the saturation of a power amplifier for better understanding of the present invention. When an excessive signal which exceeds the linear range of an amplifier is fed to that amplifier, the latter is saturated and generates a saturation voltage or clipping at its output. There are two saturation voltages; one is an upper saturated voltage (maximum) in response to a positive excessive signal input to the amplifier while the other is a lower saturation voltage (minimum) in response to a negative excessive input signal. These saturation voltages or clipping levels of the amplifier depend on the level of the supply voltage which energizes the amplifier.

In the case of a double supply amplifier with one supply terminal energized at a positive potential of $+E$ volts and the other supply terminal at a negative potential of $-E$ volts the upper saturation voltage ($V_{max}$) has the following relationship with the positive supply voltage of $+E$ volts $$V_{max} \leq +E - N \cdot V_{BE},$$

wherein N is the number of stages of output transistors in the amplifier and is typically one or two, and $V_{BE}$ indicates a voltage drop across the base and emitter electrodes of the output transistor.

Similarly, the lower saturation voltage ($V_{min}$) has the following relationship with the negative supply voltage of $-E$ volts:

$$V_{min} \geq -E + N \cdot V_{BE}$$

The saturation voltages also depend on impedance characteristics of the load coupled to the amplifier. In other words, a certain voltage drop ($\Delta V$) occurs in the amplifier depending on the value of the load. Accordingly, the above relationships may now be expressed as follows:

$$V_{max} = +E - N \cdot V_{BE} - \Delta V, \text{ and}$$

$$V_{min} = -E + N \cdot V_{BE} + \Delta V.$$

These equations indicate that once an amplifier, its supply voltages and a load are given saturation voltages or clipping levels (as observed at the final output of the amplifier) will be determined at particular values.

Figures 1, 2:
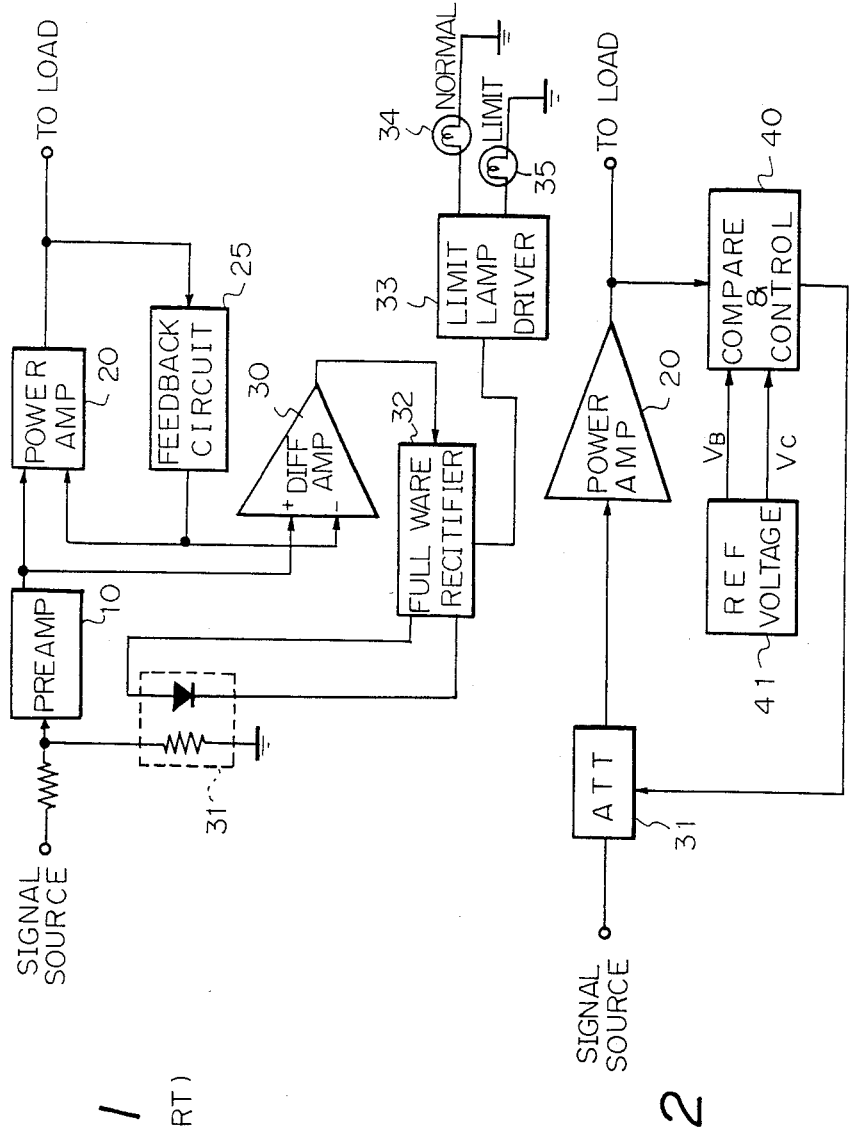
FIG. 1 shows a block diagram of a prior art apparatus for minimizing clipping distortions.
FIG. 2 shows a block diagram illustrating the concept of the present invention.

Referring now to FIG. 2, there is shown an apparatus which avoids the occurrence of clipping in accordance with the present invention. The apparatus includes a power amplifier 20 which receives a signal from a signal source via a signal attenuator 31. The amplified output signal is applied to a load such as a loud-speaker.

In accordance with an important feature of the present invention, there is provided reference means 41 which provide a first reference voltage ($V_B$) lower than the upper saturation voltage or upper clipping level ($V_{max}$) of the amplifier, and also provides a second reference voltage ($V_c$) higher than the lower saturation voltage or lower clipping level ($V_{min}$) of the amplifier output. Preferably the difference between the reference and the saturation voltage has a value which meets two requirements; one is to assure the prevention of clipping and the other is to permit the amplifier to operate substantially throughout its entire linear range.

By way of example, for a double supply amplifier having the rated power of 150 watts and coupled to a load of eight ohms, supply voltage levels will be chosen at $\pm 55$ volts; practically Vmax and Vmin are approximately $\pm 52$ volts, respectively, whereas $V_B$ and $V_C$ are approximately $\pm 49$ volts, respectively.

These reference voltages $V_B$ and $V_C$ are fed to the comparator device in comparing and control means 40 for comparison with the output signal from the amplifier. When the output signal goes out of the range extending between the upper and lower reference voltages, the comparator device produces an output and supplies it to the control device of the comparing and control means 40. Responsively, the control device develops a control signal which is fed to the signal attenuator, which, in turn, reduces the input signal to the amplifier whereby the apparatus can avoid the occurrence of clipping or saturation of the amplifier.

The above technique can be regarded as a pre-clipping control method which is in sharp contrast to a post-clipping control method as disclosed in the above-mentioned United States Patent.

Figure 6:
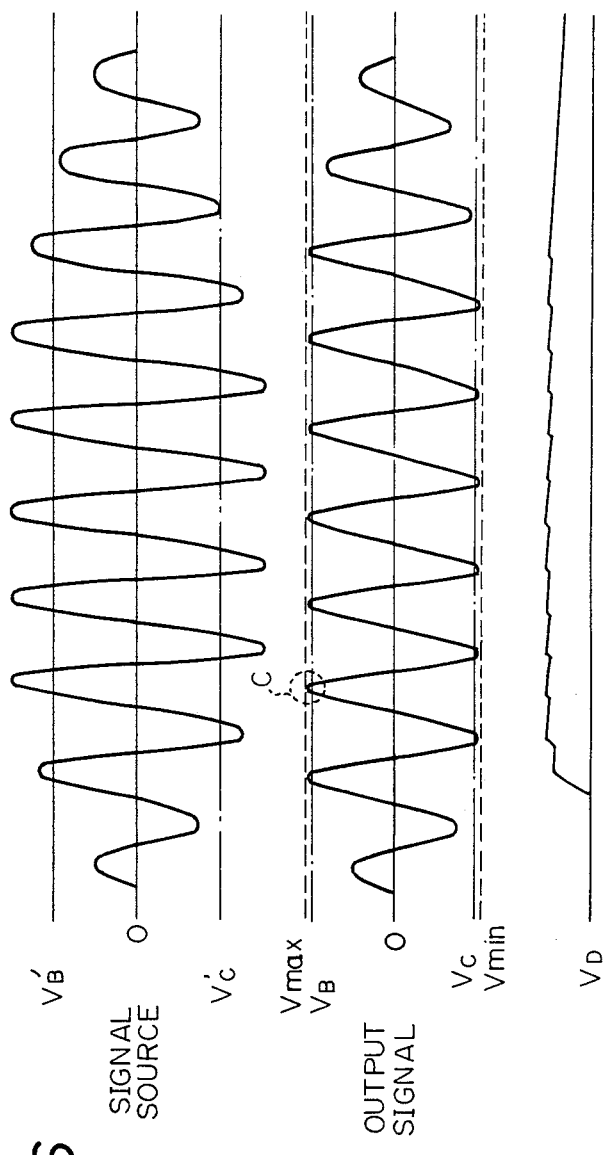
FIG. 6 shows a typical time chart of signals during the operation of the apparatus.

FIG. 6 visualizes how the amplifier input and output signals are controlled by the apparatus shown in FIG. 2. In FIG. 6, a signal supplied from a signal source is enlarged to have the same amplitude as that of the output signal of the amplifier during the normal operation of the amplifier so that the relationship or correspondence between the signals will be clarified. Actually, the source signal is much smaller than the output signal of the amplifier.

$V_B'$ indicates a particular level of source signal corresponding to the upper reference voltage $V_B$ while $V_C$ corresponds to the lower reference voltage $V_C$.

It will be seen from FIG. 6 that under normal conditions, when the source signal level is within the range between $V_{B'}$ and $V_{C'}$ (upper and lower reference voltages evaluated at the input side of the amplifier), no attenuation is introduced in the input signal to the amplifier. On the other hand, during the period in which peaks of the source signal go out of the range between $V_{B'}$ and $V_{C'}$, a controlled attenuation is introduced in the input signal to the amplifier, whereby the output signal of the amplifier is kept within the range between saturation or clipping levels $V_{max}$ and $V_{min}$, thus preventing the occurrence of clipping distortions.

Figure 3:
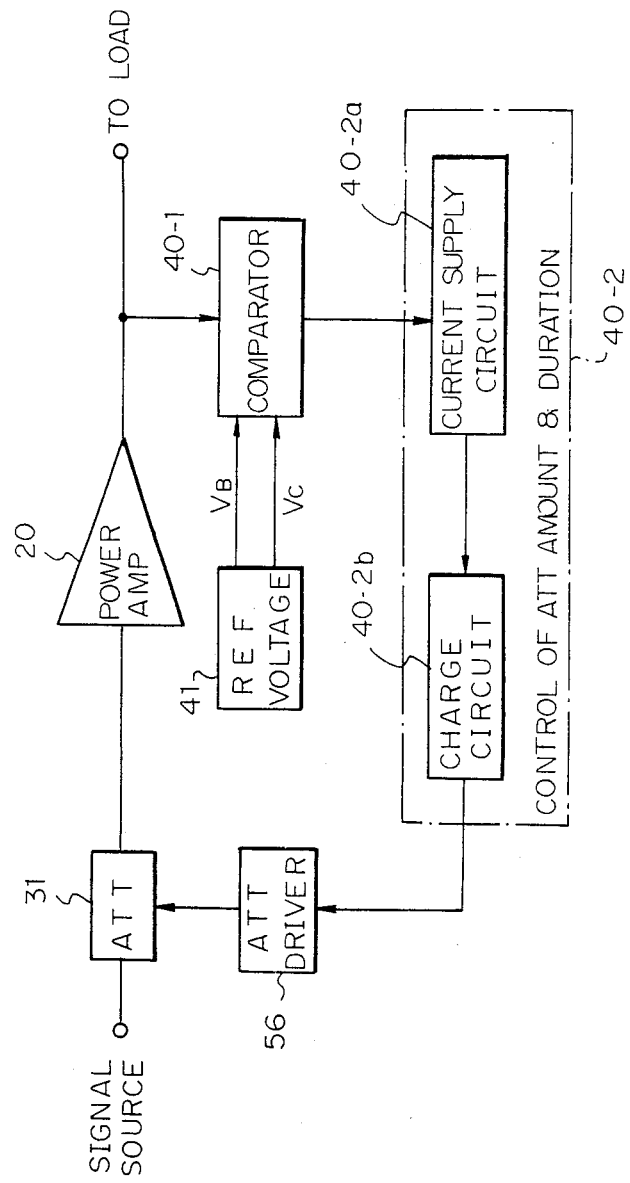
FIG. 3 is similar to FIG. 2 and includes an illustration of a control circuit 40-2 coupled to a comparator 40-1 in block form.

The control device which responds to the output signal of the comparator device to develop a signal indicative of a controlled attenuation to be introduced in the input channel of the amplifier can be implemented by various types of circuit arrangement. One example is illustrated in FIG. 3. The illustrated control device 40-2 includes a current supply circuit 40-2a which is activated by the output signal of a comparator 40-1 to supply a charging current to a charge circuit 40-2b. The charge circuit is preferably charged at a relatively high rate, thus producing a control signal indicative of the amount and duration of the attenuation to be introduced in the amplifier input channel. The control signal is coupled to an attenuator driver 56 which, then, drives the attenuator 31 connected into the input channel of the amplifier. The control device may include a discharge circuit which is coupled to the charge circuit and decreases the output signal level of the charge circuit at a relatively slow rate.

Figure 4:
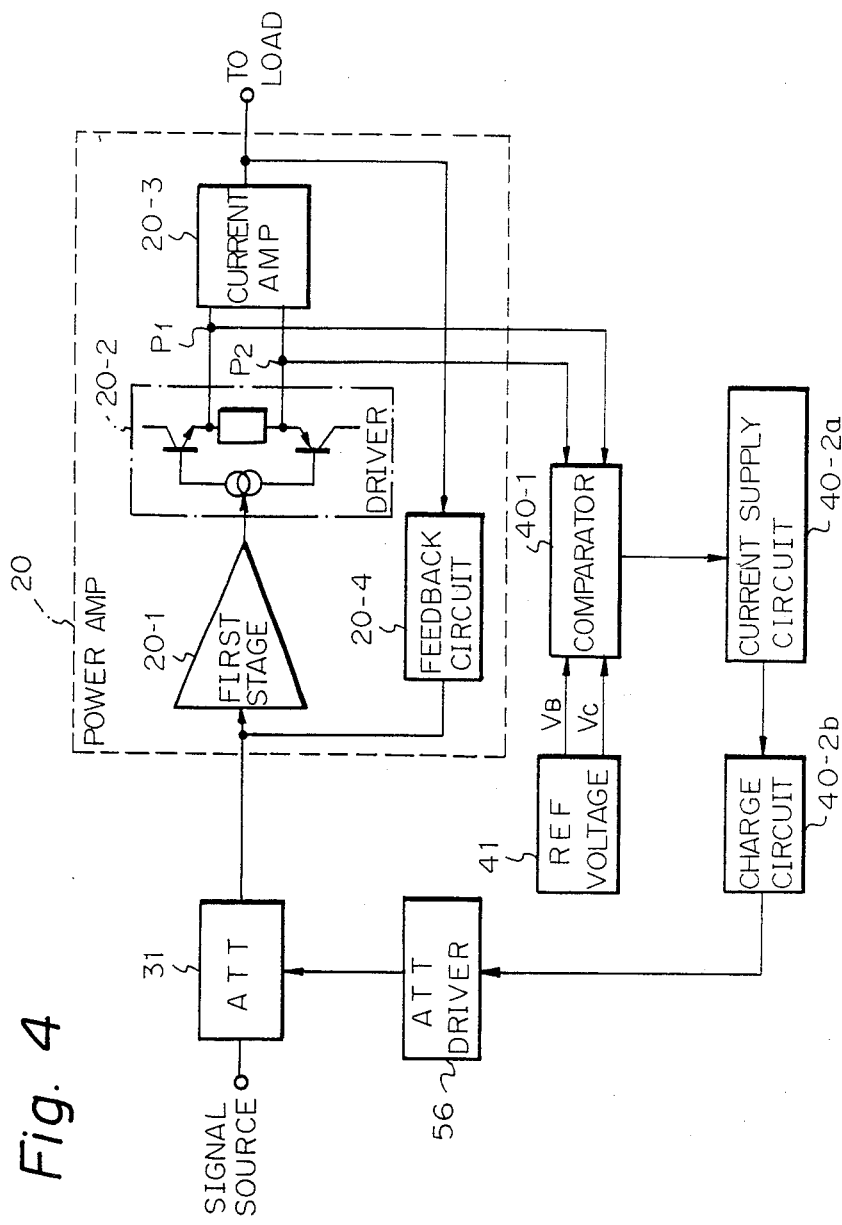
FIG. 4 is similar to FIG. 3 and includes an illustration of an internal arrangement of the power amplifier with its intermediate stage signals coupled to inputs to the comparator to immunize the apparatus to the variations in the load coupled to the amplifier.

FIG. 4 includes an illustration of the internal arrangement of the power amplifier 20. The illustrated amplifier comprises a first stage amplification circuit 20-1, a driver circuit 20-2 coupled to the first stage amplification circuit, a current amplification circuit 20-3 which constitutes the last stage of the power amplifier, and a feedback circuit 20-4 coupling the output of the last stage element (i.e. the final output of the power amplifier) to the input of the first stage amplification circuit. Preferably, an intermediate output signal, that is, the output signal of the driver circuit 20-2 which is present at points $P_1$ and $P_2$ in the input lines to the last stage element 20-3 of the power amplifier is fed to the comparator 40-1 for comparison with the upper and lower reference voltages.

This arrangement is substantially immune to variations in the load coupled to the power amplifier.

The current amplification circuit 20-3 produces a voltage drop ($\Delta V$) therein which depends on the value of the load. In one application, the load may be a single loud-speaker having a typical impedance of eight ohms. In another application, the load may be two loud-speakers in parallel connection and having an impedance of four ohms. In a still further application, the load may consist of four loud-speakers in parallel connection with the value of impedance of two ohms. For these applications, the voltage drop in the current amplification circuit 20-3 increases as the number of loud-speakers increases.

It will now be understood that the illustrated arrangement in which an intermediate output signal ahead of the current amplification circuit 20-3 is used as an input signal to the comparator is not affected by the voltage drop in the circuit 20-3 which is subject to variations depending upon the value of the load. In other words, the arrangement in FIG. 4 is applicable to a variable load, while assuring the prevention of the occurrence of clipping distortions.

Figure 5:
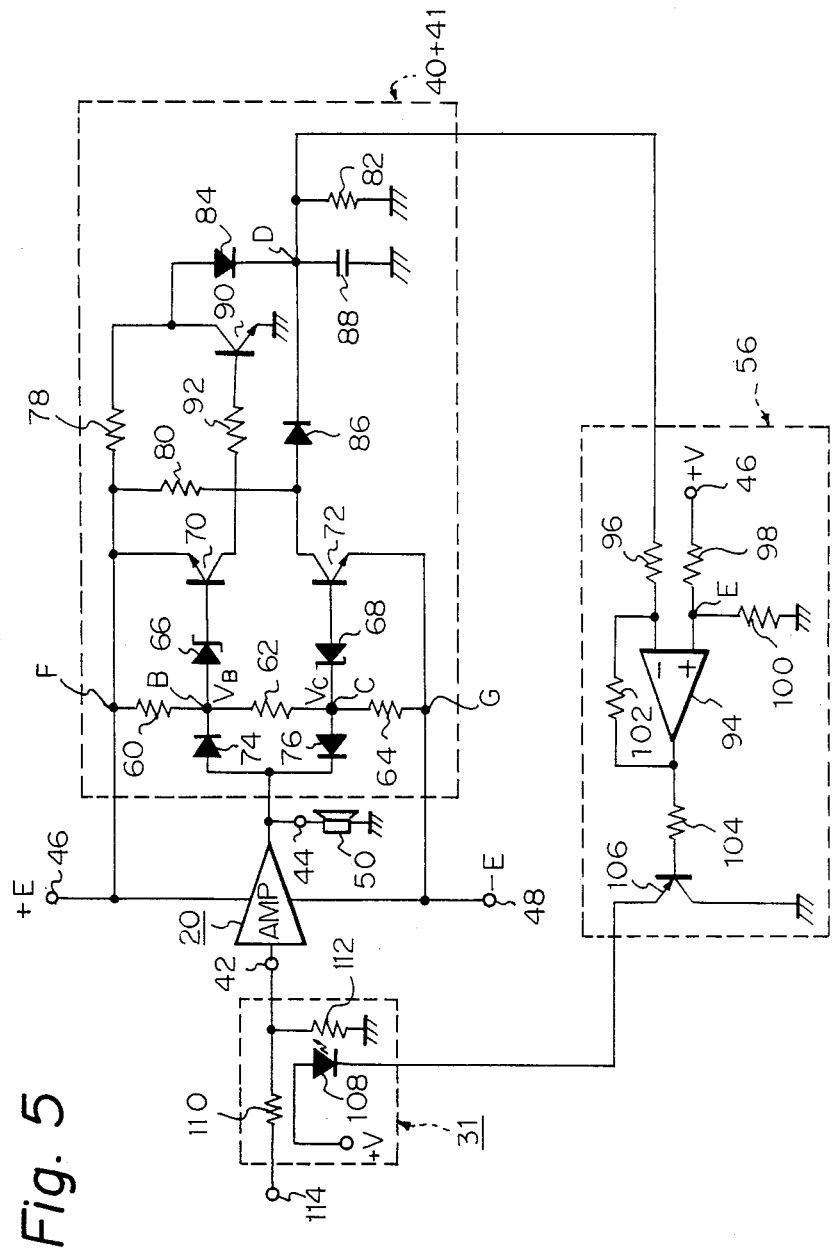
FIG. 5 is a circuit diagram of the apparatus which is applied to a double supply amplifier.

Referring now to FIG. 5, there is shown a detailed circuit diagram of a preferred embodiment of the present invention. The illustrated embodiment employs a power amplifier 20 of the double supply type with one supply terminal 46 energized at $+E$ volts and the other suuply terminal 48 energized at $-E$ volts, by means of a suitable voltage source (not shown).

The signal source is connected through a terminal 114 and a signal attenuator 31 to an input 42 of the power amplifier 20. The illustrated attenuator comprises a light emitting diode 108 which is driven by a driver circuit 56, and resistive circuit 112 which is connected between the signal source and the ground and consists of a light dependent resistor 112 such as a light conductive cell optically coupled to the light emitting diode and a line resistor 110 in series connection with the light dependent resistor 112. Preferably, the performance of the optoelectronic coupler is such that the attacking time is relatively short (e.g. 1–10 msec) whereas the release time is relatively long (e.g. 100 msec-1 sec).

The output 44 of the power amplifier is coupled with a loudspeaker 50 as its load. The amplifier output is also connected to a control unit (40+41).

The unit includes reference voltage means which provides first and second reference voltages. The illustrated reference means comprises a voltage divider connected across the supply terminals 46 and 48 and consisting of three resistors, i.e. a first resistor 60, a second resistor 62, and a third resistor 64, all connected in series. The first node or junction B between the first and second resistors 60 and 62 provides a first or upper reference voltage for comparison with positive peaks of the output signal of the power amplifier. The second node or junction C between the second and third resistors provides a second or lower reference voltage for comparison with negative peaks of the output signal of the power amplifier.

In the embodiment of FIG. 5, the unit includes means which selectively pass the output signal of the power amplifier when the signal goes out of the normal range of voltage. The illustrated selective passing means comprises a first diode 74 which is connected between the output of the power amplifier and the upper reference node B of the voltage devider, and is normally back biased to inhibit the passing of the signal to the node B. The means further comprises a second diode 76 which is connected between the output of the power amplifier and the lower reference node C of the voltage divider and is normally back biased.

In the arrangement of FIG. 5, let us assume that the upper and lower satauration voltages Vmax and Vmin (upper and lower clipping levels) are given as follows:

$$V_{max} = +E - 1.2 \text{(volts)}, \text{ and}$$

$$V_{min} = -E + 1.2 \text{(volts)}.$$

wherein $+E$ and $-E$ are supply voltage levels at the supply terminals 46 and 48 of the power amplifier.

Once the upper and lower saturateion voltages are determined, the levels of upper and lower reference voltages can be selected. For the above exemplified volues of $V_{max} = +E - 1.2$ (volts), and $V_{min} = -E + 1.2$ (volts), the reference voltages at node B and C which are developed during a normal operation with both the diode 74 and 76 being back biased may be selected to have the following values:

$$V_B \approx V_{max} - (0.6 + 0.2) = +E - 2.0 \text{(volts)}$$

wherein "0.6" indicates the voltage drop of the diode (forward breakdown voltage) and 0.2 is an exemplified value of a voltage margin for stabilization of the operation of the circuitry; similarly, $$V_C \approx V_{min} + (0.6 + 0.2) = -E + 2.0 \text{(volts)}.$$

The reference node B of the voltage divider is connected through a Zener diode 66 to a base electrode of a transistor 70. Similarly the second node C of the voltage divider is connected through a second Zener diode 68 to a base electrode of a transistor 72. The circuit is arranged such that during normal operation when both the diodes 74 and 76 are non-conductive, these Zener diodes 66 and 68 break down (are conductive) in the reverse direction. For the above values of the reference voltages, the break-down voltage of the Zener diodes ($V_Z$) may be selected as follows:

$Z_D \geq$ (the difference between the source voltage and the reference voltage) $-$ (base-to-emitter voltage of the transistor) $\approx 1.4$ (volts)

The transistor 70 is normally conductive and has an emitter electrode connected to the positive voltage source and a collector electrode connected to a base electrode of a transistor 90 through a resistor 92. The transistor 72 is normally conductive and has an emitter electrode connected to the negative voltage source and a collector electrode connected to the positive voltage source through a resistor 80 and also connected through a diode 86 to a capacitor 88 and a resistor 82 in parallel connection, both being grounded. The transistor 90 is normally conductive and has an emitter electrode which is grounded, and a collector electrode which is connected to the positive voltage source through a resistor 78 and is also connected to the capacitor 88 and the resistor 82 through a diode 84.

The table below indicates the state of various elements in the unit for various amplitudes of the input signal to the power amplifier.

TABLE

|  | Normal input | Positive excess input | Negative excess input |
| --- | --- | --- | --- |
| DIODE 74 | back biased | on | back biased |
| DIODE 76 | back biased | back biased | on |
| Voltage at NODE B ($V_B$) | $+E - 2.0$ (volts) | increases | $+E - 2.0$ (volts) |
| Voltage at NODE C ($V_C$) | $-E + 2.0$ (volts) | $-E + 2.0$ (volts) | decreases |
| ZENER DIODE 66 | breaks down | non conductive | breaks down |
| ZENER DIODE 68 | breaks down | breaks down | non conductive |
| TRANSISTOR 70 | on | off | on |
| TRANSISTOR 72 | on | on | off |
| TRANSISTOR 90 | on | off | on |
| DIODE 84 | non conductive | on | non conductive |
| DIODE 86 | back biased | back biased | on |
| Voltage at NODE D ($V_D$) | zero | increases | increases |
| Attenuation | none | introduced | introduced |

From the above Table, the reader will readily understand how the unit operates for various input conditions. Therefore, regarding operation, a brief description will suffice.

Under normal conditions, when the amplifier input signal has a amplitude within the normal range, no current flows into the capacitor 88 because both the diodes 84 and 86 are non-conductive.

Thus, the capacitor 88 which is to provide the output signal of the control unit does not develop any voltage thereacross. As a result, no attenuation is introduced in the amplifier input signal.

Figure 7:
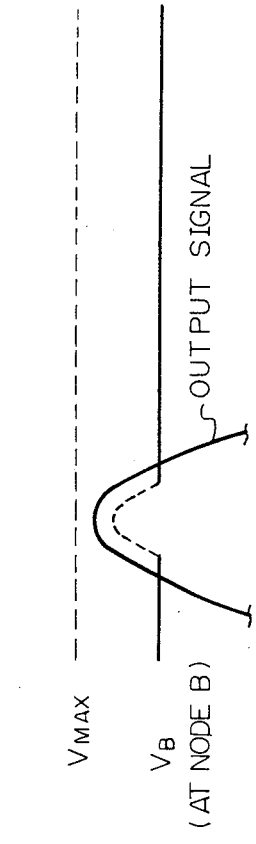
FIG. 7 shows an enlarged view of the part defined by a dot circle C in FIG. 6.

When a positive peak portion of the amplifier input signal exceeds such a level that the amplifier output signal forwardly breaks down the diode 74, the latter passes the amplifier output signal to the node B, thus increasing the voltage level at the node B (as indicated by a dot curve in FIG. 7). This increase will cause the Zener diode 66 to be non-conductive. Responsively, the transistors 70 and 90 turn off. Thus a current is supplied from the source terminal 46 to the capacitor 88 through the resistor 78 and the diode 84 which is now conductive. The capacitor 88 and the resistor 78 form a charge circuit preferably having a short time constant. The voltage $V_D$ developed across the capacitor 88 (the output signal of the control unit) is fed to a driving circuit 56 which, in turn, drives the signal attenuator so that a controlled attenuation is introduced in the amplifier input signal.

Similarly, when a negative peak portion of the amplifier input signal exceeds such a level that the amplifier output signal forwardly breaks down the diode 76, this will decrease the voltage at node C. This decrease causes the Zener diode 68 to be non-conductive. Responsively, the transistor 72 turns off. Thus a current is supplied from the source terminal 46 to the capasitor 88 through the resistor 80 and the diode 86 which is now conductive. The resistor 80 and the capacitor 88 form a charge circuit for negative peaks of the amplifier input signal and preferably having a short time constant (e.g. $1 \sim 10$ msec).

The voltage $V_D$ developed across the capacitor is fed to the driver circuit 56 which activates the signal attenuator to reduce the amplifier input signal.

The resistor 82 and the capacitor 88 form a discharge circuit such that the resistor 82 dissipates the charges stored in the capacitor 88. Preferably the discharge time constant is relatively long (e.g. 300 msec~1 sec).

Whereas various types of driver circuits for the attenuator may be used, the illustrated driver circuit comprises an operational amplifier 94 having an inverting input connected to the output of the control unit through a resistor 96, and a non-inverting input connected to the supply terminal 46 through a resistor 98, and also connected through a node E to a resistor 100 which is grounded. A feedback resistor 102 couples the output to the input of the operational amplifier 102.

The output voltage Vout of the operational amplifier 94 is given as follows:

$$V_{out} = -\frac{R_2}{R_1} V_D + \left(1 + \frac{R_2}{R_1}\right) V_E \text{ (volts)}$$

wherein $R_1$ is the resistance of the resistor 96, $R_2$ is the resistance of the resistor 102, and $V_E$ is the voltage at the node E.

It will be seen from the above formula that the output voltage of the operational amplifier 94 decreases as the signal $V_D$ from the control unit increases.

The output of the operational amplifier 94 is connected to a base electrode of a transistor 106 through a resistor 104. Thus, the transistor is non-conductive under normal conditions when the amplifier input signal level is normal and the control voltage $V_D$ produced by the unit is zero, because the output voltage of the operational amplifier and accordingly the voltage at the base electrode is sufficiently high to fully limit the base current through the transistor 106.

As mentioned earlier, the control unit will develop a significant voltage $V_D$ across the capacitor 88 in response to an excessive input signal to the power amplifier. The increase in the voltage $V_D$ serves to decrease the voltage at the base electrode of the transistor 106. The degree of conduction of the transistor 106 depends on the voltage at its base electrode, and accordingly, the level of the voltage $V_D$ developed by the control unit.

Therefore, as the voltage $V_D$ increases, the current which is supplied by the source and flows through the light emitting diode 108 of the attenuator and through the emitter—collector of the transistor 106 increases.

The light emitting diode 108 emits a light the intensity of which is controlled in accordance with the current passing therethrough, and according to the level of the control voltage $V_D$. Upon receipt of the light, the light dependent resistor or light conductive element 112 decreases its resistance, thus reducing the input signal to the power amplifier 20, with the result that the clipping is safely prevented.

While the embodiment in FIG. 5 shows Zener diodes 66 and 68 which are connected between reference nodes B, C and the transistors 70, 72, respectively, these diodes can be connected between nodes F, G and the emitter electrode of transistors 70, 72, respectively. In this case, the reference nodes B and C are directly connected to the respective base electrodes of transistors 70 and 72.

Figure 8:
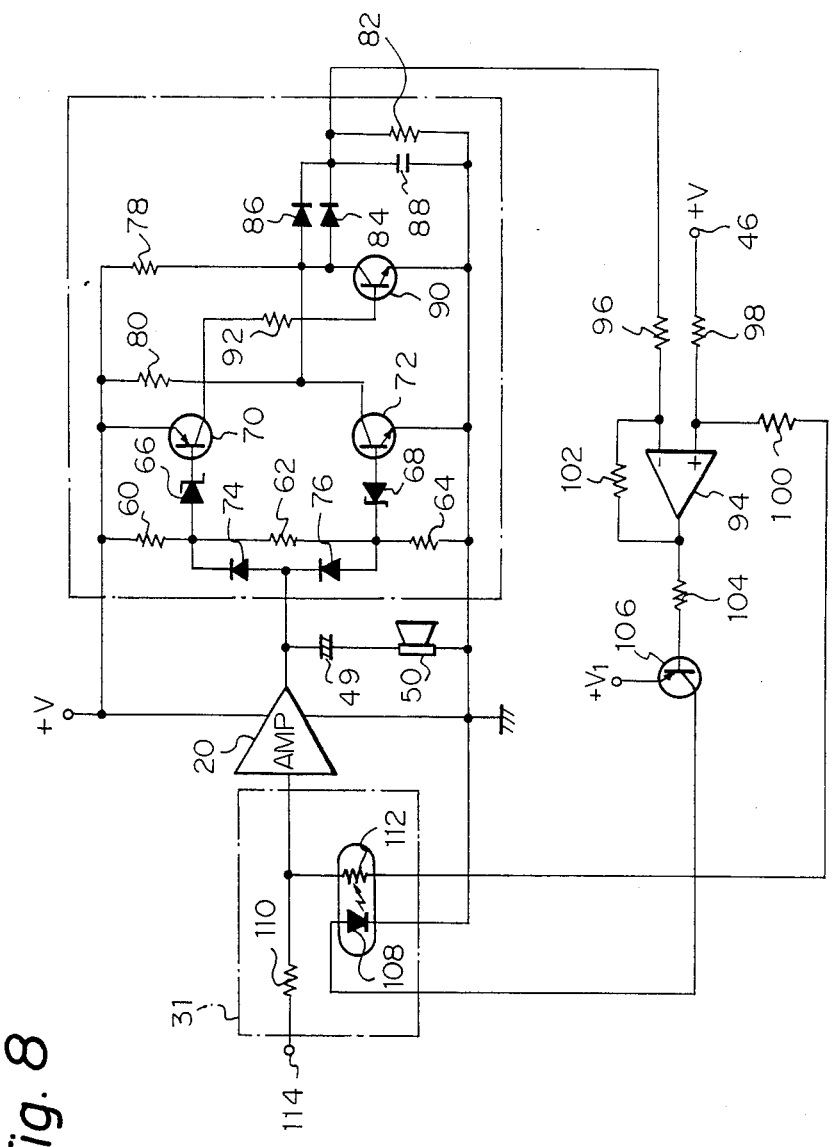
FIG. 8 is a circuit diagram of the apparatus which is applied to a single supply amplifier.

The technique of preclipping control in accordance with the present invention is applicable to a power amplifier of the single supply type with one supply terminal being grounded. An example is illustrated in FIG. 8. The reference number 49 designates an output capacitor which has the function of removing the DC component which otherwise would be coupled to the loudspeaker 50, as is known per se. Since the operation of this embodiment is substantially identical with that of the embodiment in FIG. 5 and can be readily understood from the above Table by changing "—E+2.0 (volts)" to read—O (ground)+2.0 (volts)—, further description will be omitted.

The embodiments in FIGS. 5 and 8 utilize the final output signal of the power amplifier to compare it with the reference voltages. It is evident, however that the technique of the use of an intermediate output signal as disclosed in FIG. 4 can be applied to the embodiments of FIGS. 5 and 8.

Whereas the present invention has been described with respect to several preferred embodiments, it should be construed that various modifications can be made without departing from the scope and sprit of the present invention as defined in the appended claims.

What is claimed is:

1. In an apparatus for preventing clipping distortions evidenced in an output signal of an amplifier in association with the saturation of said amplifier having upper saturation and lower saturation voltages, comprising:
a reference means for providing an upper reference voltage lower than said upper voltage and a lower reference voltage higher than said lower saturation voltage;
an attenuator means for introducing a variable attenuation in an input signal to said amplifier;
a comparing means for comparing said upper and lower reference voltages with said output signal from said amplifier and for generating an output signal when said amplifier output signal goes out of a voltage range between said upper and lower reference voltages;
a control means coupled to said comparing means and said attenuator means for controlling said attenuator means so that said attenuator means reduces said input signal to said amplifier when said output signal from said amplifier goes out of said voltage range between said upper and lower reference voltages, whereby said amplifier always operates properly without producing any clipping in its output signal;
said control means including an electrical energy storing means which comprises a charge circuit having a relatively short time constant and a discharge circuit having a relatively long time constant whereby said apparatus responds quickly to said output signal from said comparing means and maintains a controlled attenuation in said input signal to said amplifier whenever there is a risk of an occurence of clipping.

2. An apparatus as claimed in claim 1, wherein said amplifier is of a double voltage supply type having a pair of voltage supply terminals respectively energized at +E volts and −E volts.

3. An apparatus as claimed in claim 1, wherein said amplifier is of a single voltage supply type having a pair of supply terminals, one of which being grounded.

4. An apparatus as claimed in claim 1, wherein said reference means comprises a voltage divider connected to a voltage source which also energized said amplifier.

5. An apparatus as claimed in claim 4, wherein voltage divider consists of three resistors connected in series, whereby a first node between a first resistor and a second resistor provides said first reference voltage, and a second node between said second resistor and a third resistor provides said second reference voltage.

6. An apparatus as claimed in claim 5, wherein said control means further includes;

a means connected between an output of said amplifier and said first and second reference nodes of said voltage divider for selectively passing said output signal from said amplifier to said reference nodes when said output signal from said amplifier exceeds a predetermined amplitude, and a switch means coupled to said voltage divider for selectively charging said storing means when said passing means passes said amplifier output signal to said reference nodes, and a driver means coupled to said storing means for selectively driving said attenuator means in accordance with an output of said storing means.

7. An apparatus as claimed in claim 1, wherein said attenuator means comprises a light emitting diode and a light dependent resistor optically coupled to said light emitting diode.

8. An apparatus as claimed in claim 1, wherein said control means outputs a signal indicative of a controlled amount and time duration of attenuation to said attenuator means in accordance with said output signal from said comparing means.

9. An apparatus as claimed in claim 8, wherein said comparing means includes a switch means which selectively operates when said amplifier output signal goes out of the range between said upper and lower reference voltages, and wherein said control means further includes a current supplying means coupled to said switch means and a current source for selectively supplying a charging current to said storage means whenever said switch means operates, whereby a resultant charged level in said storage means indicates a controlled amount and duration of attenuation to be introduced in said input signal to said amplifier.

10. An apparatus as claimed in claim 1, wherein said storage means comprises a capacitor-resistor charging circuit having a relatively short time constant and a capacitor-resistor discharging circuit having a relatively long time constant.

11. An apparatus as claimed in claim 1, wherein said amplifier comprises a first stage amplification circuit, a driver circuit coupled to said first stage amplification circuit, a current amplification circuit coupled to said driver circuit and a feed-back circuit for feeding an output signal of said current amplification circuit to an input of said first stage amplification circuit, and wherein said comparing means compares an output signal from said driver circuit with said upper and lower reference voltage such that a comparison is made without being affected by a voltage drop in said current amplification circuit, said voltage drop in said current amplification circuit being dependent upon a value of a load coupled to said amplifier.

* * * * *